(12) United States Patent
Yoeli et al.

(10) Patent No.: US 6,294,927 B1
(45) Date of Patent: Sep. 25, 2001

(54) CONFIGURABLE CELL FOR CUSTOMIZABLE LOGIC ARRAY DEVICE

(75) Inventors: Uzi Yoeli, Haifa (IL); Meir Janai, Palo Alto, CA (US)

(73) Assignee: Chip Express (Israel) LTD, Haifa (IL)

( * ) Notice: Subject to any disclaimer, the term of this patent is extended or adjusted under 35 U.S.C. 154(b) by 0 days.

(21) Appl. No.: 09/595,085

(22) Filed: Jun. 16, 2000

(51) Int. Cl.[7] .................................................. A03K 19/177
(52) U.S. Cl. .................................................. 326/40; 326/38
(58) Field of Search ........................................ 326/37–41

(56) References Cited

U.S. PATENT DOCUMENTS

| | | | |
|---|---|---|---|
| 5,428,304 | 6/1995 | Landers et al. | 326/41 |
| 5,684,412 | 11/1997 | Yoeli et al. | 326/39 |
| 5,751,162 | 5/1998 | Mehendale et al. | 326/37 |
| 5,751,165 | 5/1998 | Yoeli et al. | 326/47 |
| 5,861,641 | 1/1999 | Yoeli et al. | 257/211 |
| 5,894,565 | * 4/1999 | Furtek et al. | 326/38 |
| 5,999,015 | * 12/1999 | Cliff et al. | 326/39 |

* cited by examiner

*Primary Examiner*—Michael Tokar
*Assistant Examiner*—Don Phu Le
(74) *Attorney, Agent, or Firm*—Ladas & Parry

(57) ABSTRACT

This invention discloses a cell forming part of a customizable logic array device, the cell including at least first and second multiplexers, each having a select input and an output, at least two inverters, each having an input and an output, and electrical connections, selectably connecting the output of the first multiplexer to either the select input of the second multiplexer or to the input of one of the at least two inverters.

A customizable logic array device including a plurality of cells, each cell including at least first and second multiplexers is also disclosed.

32 Claims, 8 Drawing Sheets

CONFIGURABLE CELL FOR CUSTOMIZABLE LOGIC ARRAY DEVICE

FIELD OF THE INVENTION

The present invention relates to application-specific integrated circuits generally and more particularly to the structure of the principal building blocks of gate arrays in multi-metal semiconductor devices.

BACKGROUND OF THE INVENTION

Application specific integrated circuits (ASICs) are microelectronic devices that are designed and configured to carry out sets of instructions for specific applications. Application specific integrated circuits are preferable over general-purpose of-the-shelf devices when speed, performance or device compactness is desired, or when the specific functionality cannot be obtained by available devices. Generally, the logic portion of an ASIC device is implemented by either standard cell or gate array technology. In the gate array technology an array of cells comprising simply interconnected transistors is provided by tiling and repeating the same cell over and over again. Sometimes a gate array block may be found within a standard cell device or a full custom device. In gate array technology, the metal interconnections are customized for each application. The customization of the metal interconnection layers determines the functionality of the cells and enables the desired application.

For purpose of simplicity, cost savings and short delivery time it is desirable to minimize the number of metal interconnect layers that need to be modified to implement a given functionality. For that purpose, the repetitive cells that build the array must be designed and constructed so they can provide simple as well as complex functionality with minimal overall modifications of the device.

U.S. Pat. Nos. 5,684,412, 5,751,165 and 5,861,641 describe logic cells comprising a cascade of multiplexers that are useful for a gate array that can be programmer by modifying only one or two layers of a multi-layer interconnect structure of the device. The function of each of these cells is input selectable. However, those logic cell structures have the drawback that when it is desirous to implement two simple functions such as two inverters in parallel, two separate unit logic cells have to be employed. This reduces the area utilization of the device, reduces its performance and increases its cost.

The following additional U.S. Patents also represent the state of the prior art: U.S. Pat. Nos. 5,751,162; 5,428,304.

SUMMARY OF THE INVENTION

The present invention seeks to provide an improved customizable logic array device and cell therefor.

There is thus provided in accordance with a preferred embodiment of the present invention a cell forming part of a customizable logic array device, the cell including at least first and second multiplexers, each having a select input and an output, at least two inverters, each having an input and an output, and electrical connections, selectably connecting the output of the first multiplexer to either the select input of the second multiplexer or to the input of one of the at least two inverters.

Further in accordance with a preferred embodiment of the present invention the at least first and second multiplexers include at least three multiplexers and the at least two inverters include at least three inverters.

Still further in accordance with a preferred embodiment of the present invention the multiplexers are implemented in at least one metal layer and said electrical connections include vias connecting said at least one metal layer to another metal layer other than said at least one metal layer.

Preferably the another metal layer is a top metal layer.

Alternatively, the another metal layer is an intermediate metal layer.

Moreover in accordance with a preferred embodiment of the present invention the another metal layer is a metal layer lying immediately above the at least one metal layer.

Additionally in accordance with a preferred embodiment of the present invention the cell being further characterized in that it has a programmable logic function. Preferably the programmable logic function is programmable by selection of at least one input to the at least first and second multiplexer and by selectable connection of the electrical connections.

Additionally, the selectable connection is effected by metal deposition patterned and etched.

Alternatively, the selectable connection is effected by application of laser energy to the electrical connections for eliminating portions thereof.

Still further in accordance with a preferred embodiment of the invention the selectable connection may be effected by application of electrical energy to the electrical connections.

Additionally in accordance with a preferred embodiment of the present invention the selectable connection is effected by metal deposition and etching.

Further in accordance with a preferred embodiment of the present invention the cell includes at least three inverters each having generally identical driving power.

Still further in accordance with a preferred embodiment of the present invention at least two of the at least three inverters each have generally identical driving power and a third of the at least three inverters has a driving power different from the driving power of the at least two of the at least three inverters.

Furthermore in accordance with a preferred embodiment of the present invention at least two of the at least three inverters each have generally identical driving power and a third of the at least three inverters has a driving power which is at least double the driving power of each of the at least two of the at least three inverters.

Furthermore in accordance with a preferred embodiment of the present invention the cell includes no more than three multiplexers, no more than five inverters and only a single NAND gate.

There is also provided in accordance with yet another preferred embodiment of the present invention a cell forming part of a customizable logic array device, the cell including at least first and second multiplexers, at least two inverters, and electrical connections, selectably connecting the at least first and second multiplexers and the at least two inverters such that the multiplexers operate either in parallel or in series.

Further in accordance with a preferred embodiment of the present invention the multiplexers are implemented in at least one metal layer and the electrical connections include vias connecting the at least one metal layer to another metal layer other than the at least one metal layer.

Preferably the another metal layer is a top metal layer.

Alternatively, the another metal layer is an intermediate metal layer.

Moreover in accordance with a preferred embodiment of the present invention the another metal layer is a metal layer lying immediately above the at least one metal layer.

There is also provided in accordance with another preferred embodiment of the present invention a customizable logic array device including a plurality of cells, each cell including at least first and second multiplexers, each having a select input and an output, at least two inverters, each having an input and an output, and electrical connections, selectably connecting the output of the first multiplexer to either the select input of the second multiplexer or to the input of one of the at least two inverters.

Further in accordance with a preferred embodiment of the present invention the at least first and second multiplexers include at least three multiplexers and the at least two inverters include at least three inverters.

There is further provided in accordance with yet another preferred embodiment of the present invention a customizable logic array device including a plurality of cells, each cell including at least first and second multiplexers, at least two inverters, and electrical connections, selectably connecting the at least first and second multiplexers and the at least two inverters such that the multiplexers operate either in parallel or in series.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Figure 1:
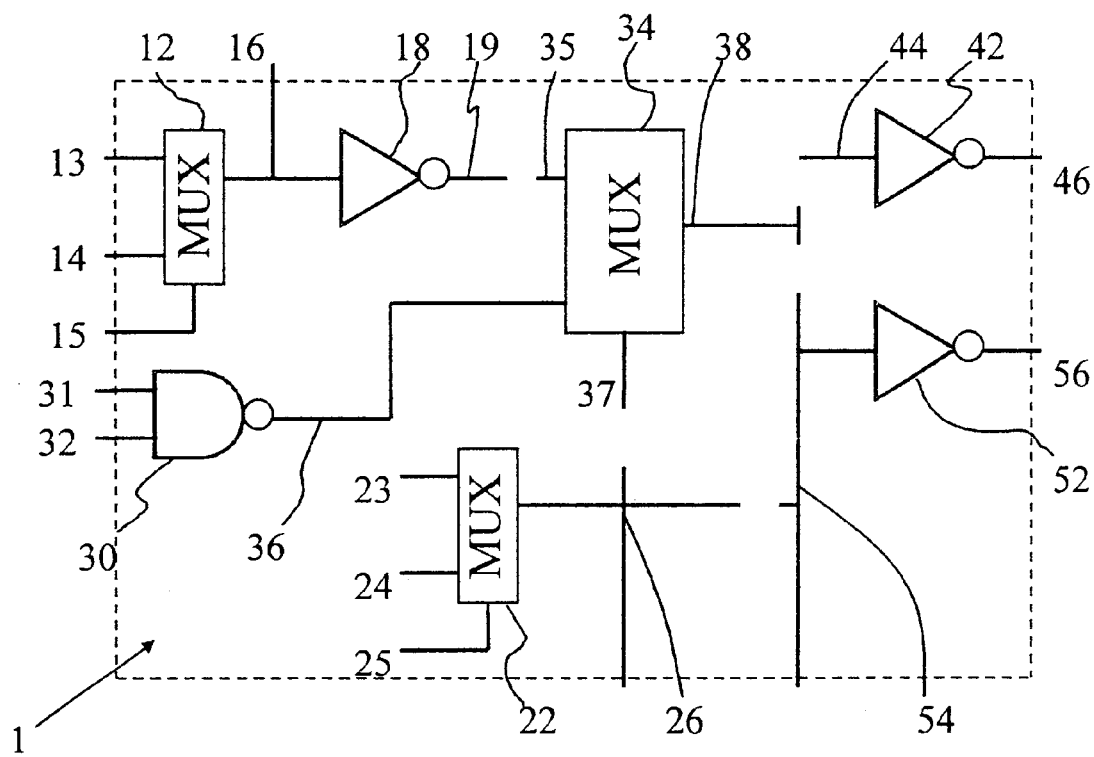
FIG. 1 is a simplified schematic illustration of a base cell constructed and operative in accordance with a preferred embodiment of the present invention.

Reference is now made to FIG. 1, which illustrates a single unit logic cell 1 constructed and operative in accordance with a preferred embodiment of the present invention. The unit logic cell comprises multiple circuit elements, generally similar to those illustrated in U.S. Pat. No. 5,684,412, but with a major distinction that the various elements are not fixedly connected to each other. Rather, the connections between the elements can be reconfigured, as will be described below.

The unit logic cell comprises a first multiplexer 12, having first and second inputs 13 and 14, a select input 15 and an output 16, a second multiplexer 22 having first and second inputs 23 and 24 and a select input 25, a NAND gate 30 having inputs 31 and 32, and a third multiplexer 34 having first and second inputs 35 and 36 and a select input 37. The output 16 of multiplexer 12 is fed to an inverter 18, and the output 36 of the NAND gate 30 is connected to the second input 36 of the multiplexer 34.

The output 19 of inverter 18 can be selectably connected to the first input 35 of the third multiplexer 34. The output 26 of multiplexer 22 can be selectably connected to either the select input 37 of multiplexer 34 or to the input 54 of a second inverter 52. The output 38 of multiplexer 34 can be selectably connected to the input 44 of a third inverter 42, to the input 54 of the second inverter 52, or to both. The inverters 18, 42 and 52 are inverting drivers, also referred below simply as "inverters". Their connection to the respective multiplexers forms inverting multiplexers with drive strengths as outlined below.

Simplicity is a particular feature of the cell of FIG. 1. Preferably the cell of FIG. 1 includes no more than three multiplexers and no more than three inverters. Preferably, only a single NAND gate is provided.

Figure 2A:
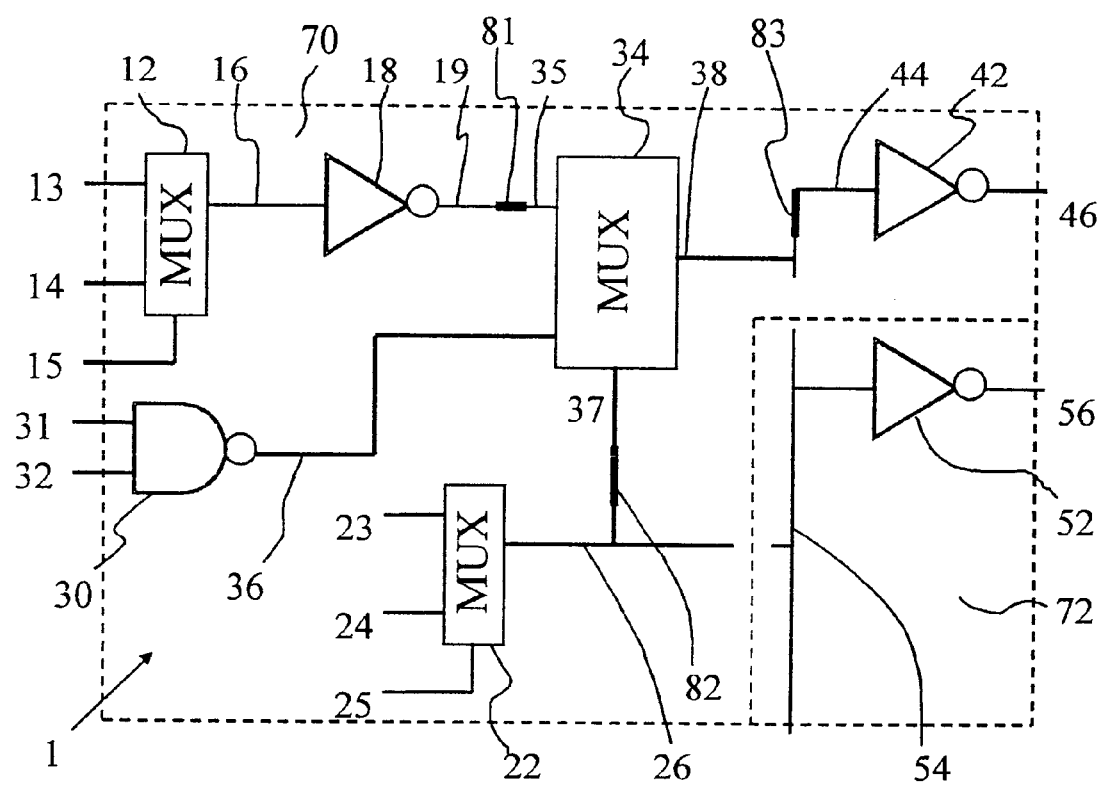
FIG. 2A is a simplified illustration of one configuration of the cell of FIG. 1.

Reference is now made to FIG. 2A, which shows one configuration of the cell of FIG. 1. It is seen that when output 19 of the first inverter 18 is connected to input 35 of the third multiplexer 34, the output 26 of the second multiplexer 22 is connected to select input 37 of the third multiplexer 34, and output 38 of the third multiplexer 34 is connected to input 44 of the third inverter 42, the structure of the resulting cell, shown within dotted lines designated by reference numeral 70, becomes practically the same as that of the cell described in the prior art (U.S. Pat. No. 5,684,412). In this configuration, the inverter 52 shown within dotted lines 72 is not operative in the cell.

Figure 2B:
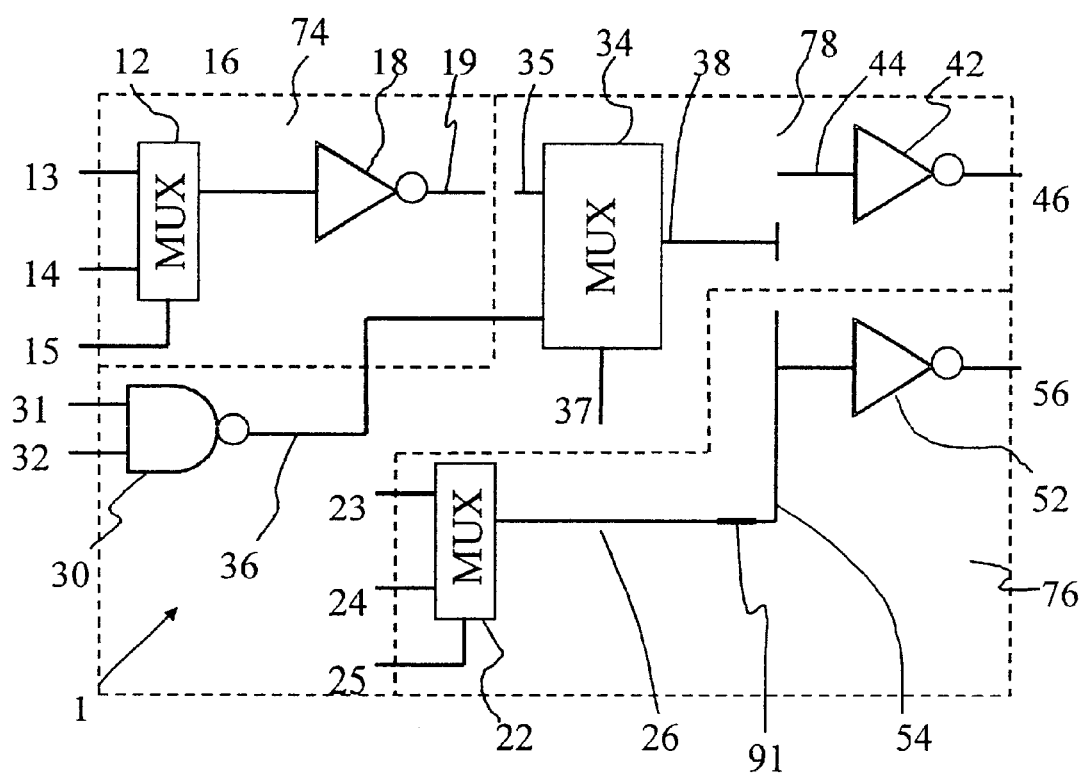
FIG. 2B is a simplified illustration of another configuration of the cell of FIG. 1.

Reference is now made to FIG. 2B, which illustrates an alternative configuration of the cell of FIG. 1. In contrast to the configuration shown in FIG. 2A, in the configuration of FIG. 2B, output 26 of multiplexer 22 is connected to input 54 of inverter 52, and no connection is provided between output 19 of inverter 18 and input 35 of multiplexer 34. The resulting logic cell thus defines two inverting multiplexers which are shown within dotted lines respectively designated by reference numerals 74 and 76. The circuit elements shown within dotted lines designated by reference numeral 78 are not operative in this cell configuration. The two inverting multiplexers can operate in parallel, with inputs 13 and 14 of multiplexer 12 being equivalent to inputs 23 and 24 of multiplexer 22, and select input 15 of multiplexer 12 being equivalent to select input 25 of multiplexer 22 and output 19 of inverter 18 being equivalent to output 56 of inverter 52.

Each of these inverting multiplexers can be further programmed through its inputs to perform a simple, different, input-selectable logic function. For example, when the first input 13 is set to 0 (e.g. connected to Vss), a signal A is connected to input 14 and a signal B is connected to the select input 15, the inverting multiplexer within dotted lines 74 performs the logic function NAND. The same is true for the inverting multiplexer within dotted lines 76. When the first input 13 is connected to a signal A, input 14 is set to 1 (e.g. connected to Vdd) and a signal B is connected to the select input 15, the inverting multiplexer within dotted lines 74 performs the logic function NOR. The same is true for the inverting multiplexer within dotted lines 76.

When the first input 13 is set to 0 (e.g. connected to Vss), the second input 14 is set to 1 (e.g. connected to Vdd) and a signal B is connected to the select input 15 the inverting multiplexer within dotted lines 74 performs as an inverter. The same is true for the inverting multiplexer within dotted lines 76.

The configurability of the interconnects of the various element of the cell of FIG. 1 provides the following useful properties:

a) In the prior art cells, when two simple logic functions need to be implemented in parallel, such as two multiplexers, a NOR and a NAND, an inverter and a NOR, or an inverter and a NAND, in each case the design requires two separate logic cell sites. With the configurable logic cell of FIG. 1, one can break up the logic cell to operate two separate logic functions in parallel within the same logic cell. This property allows higher area utilization of the device, which leads to reduction in cost and increase in device density.
   b) The selectable connectivity of output 38 of multiplexer 34 to the inverters 42 and 52 allows connecting one or two inverters in parallel. This is useful for matching the desired drive strength to the external load for achieving optimal rise time of the load line. For low external load, only one inverter may be connected so as to minimize the internal load that limits the rise time, and for high external load, the two inverters may be connected to output 38 and operated in parallel, to achieve maximum driving power.

Preferably the transistor sizes of the multiplexer 12 should be identical to the transistor sizes of multiplexer 22, and the transistor sizes of inverter 52 should be identical to those of inverter 18. Thus, when output 26 is connected to input 54, the elements shown within dotted lines 74 and 76 are identical, with output 19 matching output 56 with same rise time and drive strength. This is important for use with automatic design tools that need to utilize these structures for design implementation, and should be able to select the one or the other inverting multiplexer interchangably for implementing a given logic function with given characteristics. In contrast, inverter 42 may be selected to be different from the other two inverters. Preferably inverter 42 may have double the transistor size of inverter 52. This may enable a total driving strength of 1×, 2× or 3× of that of the inverter 52 alone to be attained, when connecting the output 38 to input 54 only, to input 44 only or to input 44 and 54 in parallel, respectively.

As can be seen from FIG. 1, additional combinations of the elements are possible beyond those shown in FIGS. 2A and 2B. For example, as a variation of the arrangement of FIG. 2A, output 46 may be connected to input 54, thus achieving a further level of signal inversion. In this arrangement inverters 42 and 52 operate in series.

In another embodiment which may be considered as a variation of the arrangement of FIG. 2B, external signals may be supplied to input 35 and select input 37, in which case the cell may be broken into three parallel elements, e.g. by connecting output 38 to input 44 within dotted lines 78 of FIG. 2B.

Referring now to FIGS. 3, 4A, 4B, & 5 it is appreciated that the connections between the elements of the logic cell for configuring the cell to perform one or more independent logic functions can be realized in several ways. Generally the implementation of the elements of the logic cell shown in FIG. 1 is performed in the bottom layers of the microelectronic device (generally at the semiconductor level, the gate level and at the first metal layer). It may, however, be desirable to implement the connections that select the configuration of the cell in the top metal layer. This involves minimum cost and effort when bug fixes or device iterations are required, as only one photolithographic mask must be re-made and only one metal layer must be re-processed.

In one preferred embodiment the connections identified in FIGS. 2A and 2B by reference numerals 81, 82, 83 and 91 may take the form of metal bridges between terminals located at the top metal layer. These terminals may be connected to metal segments at the bottom of the device that form the inputs and outputs shown schematically in FIG. 1.

The connections between the top layer terminals and the bottom metal inputs and outputs may be realized by standard microfabrication techniques known in the art, such as stacked vias or a cascade of vias extending through the dielectric layers of the multi-layer device and being connected by metal connecting segments in the various metal layers (not shown).

Figure 3:
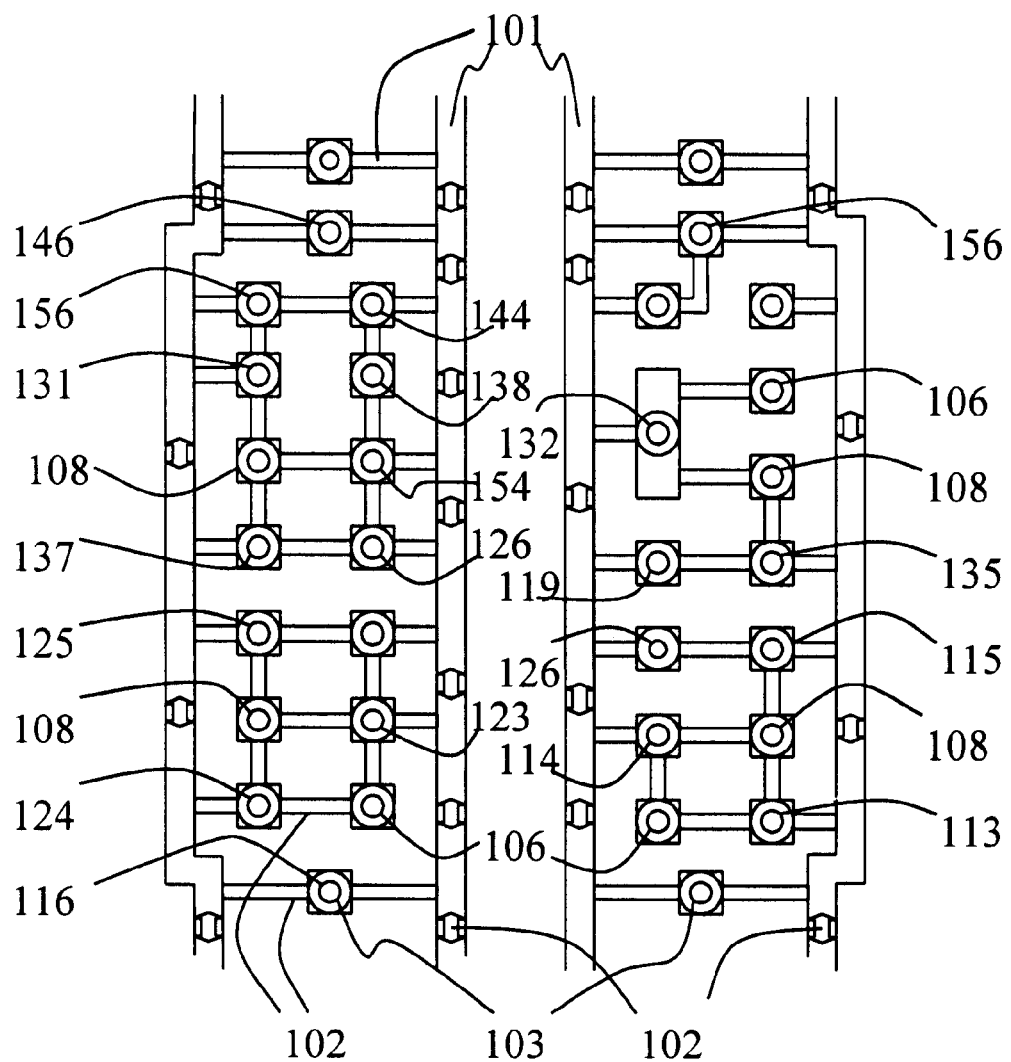
FIG. 3 is a preferred interconnection structure useful in the configuration and customization of the cell structure of FIG. 1.

FIG. 3 shows a section of the top metal layer, which constitutes one preferable interconnection arrangement for configuring the logic cell of FIG. 1. The interconnection arrangement also carries input and output signals to and from the cells, and may be used for programming the functionality of the logic cells. FIG. 3 shows a top metal layer 101 having segments 102 that operate as removable links or as connectable links. Vias 103 are also shown. The vias connect the top metal layer 101 to underlying metal layers (not shown) and also connect to the logic cell inputs and outputs. Specifically, all the inputs and outputs, identified by reference numerals in FIG. 1 are connected to corresponding terminals in the top metal layer, which are identified in FIG. 3 by corresponding reference numerals incremented by 100. In addition, reference numerals 106 and 108 in FIG. 3 indicate terminals connected by vias to the Vss potential (logic 0) and Vdd potential (logic 1), respectively.

Figure 4A:
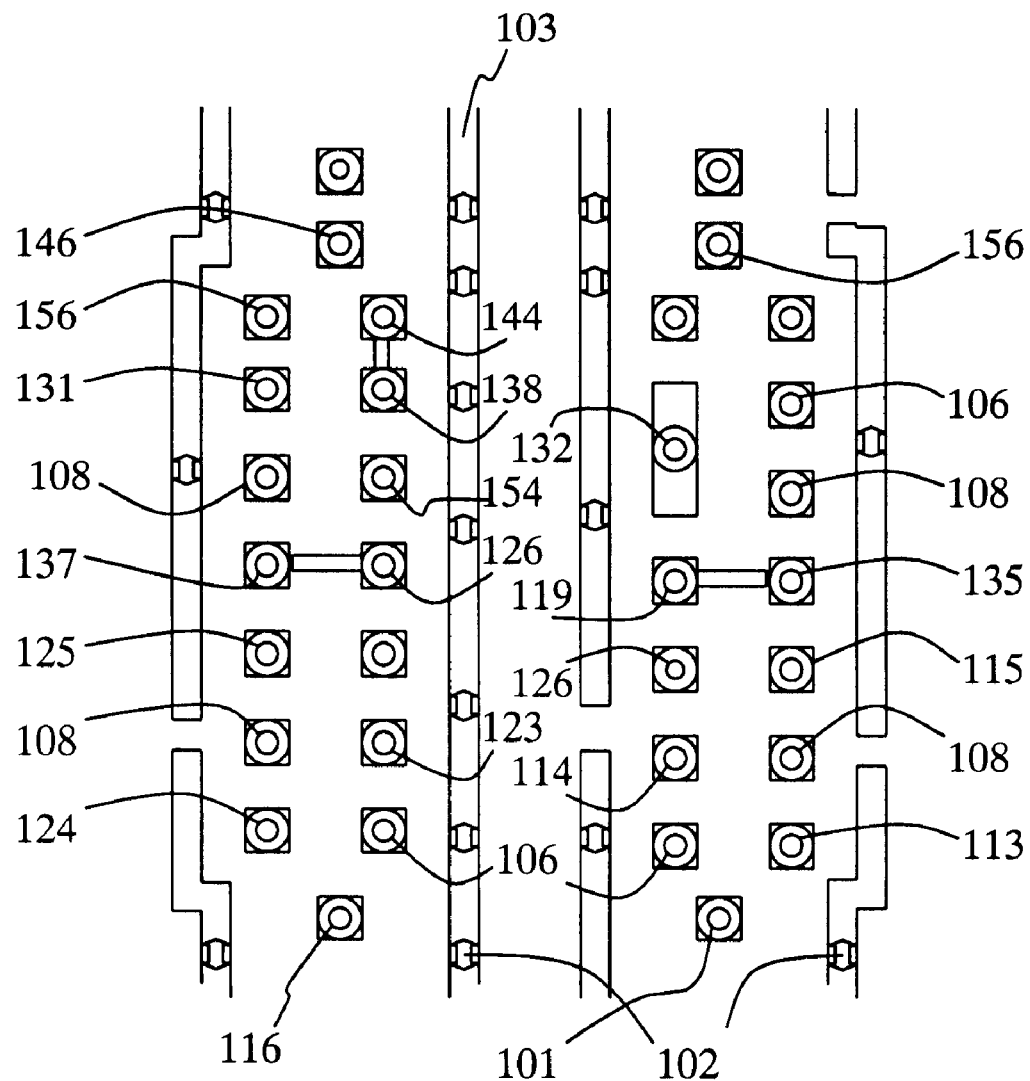
FIG. 4A is a simplified illustration of a preferred customization scheme of the structure of FIG. 3 for implementing the cell configuration of FIG. 2A.

FIG. 4A shows an implementation of the connectivity in the top metal for implementing the cell configured in FIG. 2A. In FIG. 4A, a connection is formed between terminals 119 and 135, between terminals 126 and 137 and between terminals 138 and 144, while the connection between terminals 126 and 154 is broken.

Figure 4B:
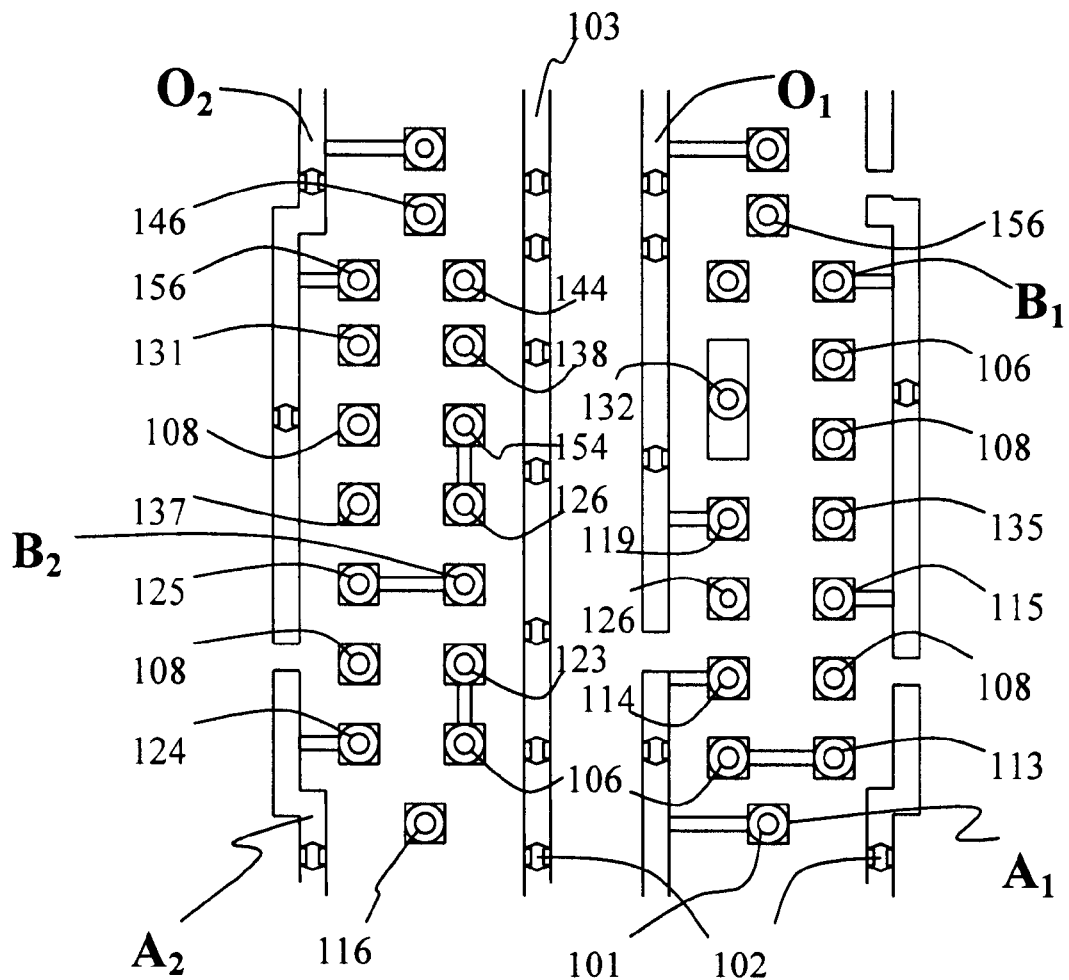
FIG. 4B is a simplified illustration of a preferred customization scheme of the structure of FIG. 3 for implementing the cell configuration of FIG. 2B.
Figure 5:
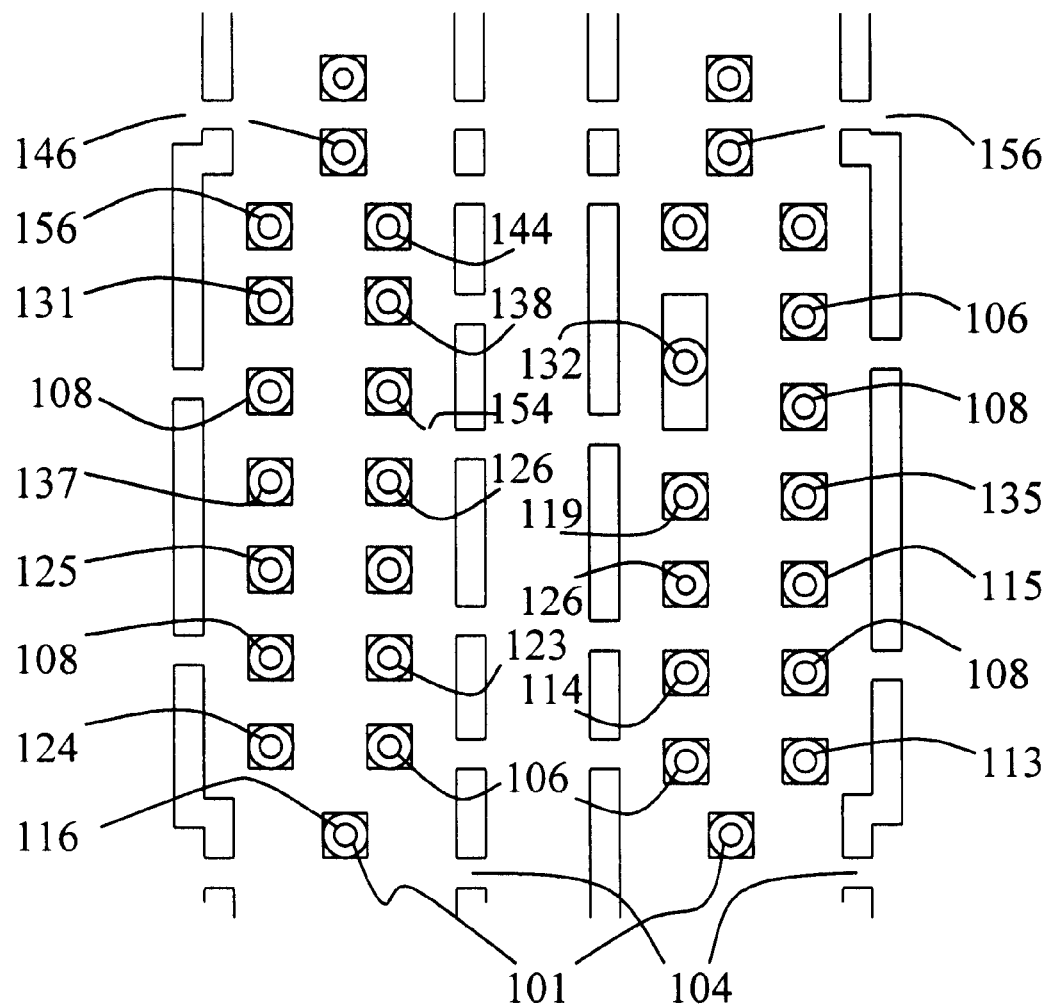
FIG. 5 is another preferred interconnection structure useful in the configuration and customization of the cell structure of FIG. 1.

FIG. 4B shows the implementation of the connectivity in the top metal for implementing the cell configured in FIG. 2B. In FIG. 4B, a connection is formed between terminals 126 and 154, while the connections between terminals 119 and 135 and between terminals 154 and 138 are broken.

It is appreciated that in both FIGS. 4A and 4B, many other connections between various terminals are also broken.

FIG. 4B further illustrates the implementation of two parallel logic NAND functions in the two sub-cells within dotted lines 74 and 76 that are formed by the above connections. In FIG. 4B, a connection is formed between the Vss terminals 106 and terminals 113 and 123, which terminals are connected in turn to the first inputs 13 and 23 of multiplexers 12 and 22, as shown schematically in FIG. 2B.

Signals $A_1$, $B_1$, and $A_2$, $B_2$ are supplied along vias, connected to signal lines in the underlying interconnect layer (not shown), to the multiplexers 12 and 22 of the sub-cells within dotted lines 74 and 76 respectively of FIG. 2B. Thus it may be appreciated that signal A1 is supplied through terminal 114 to input 14 of multiplexer 12, signal B1 is supplied through terminal 115 to input 15 of multiplexer 12, signal A2 is supplied through terminal 124 to input 24 of multiplexer 22 and signal B2 is supplied through terminal 125 to input 25 of multiplexer 22.

FIG. 4B also shows a vertical metal track 103 that is not used for cell configuration or for carrying an input or output signal for this specific cell implementation. This track can be used as a bypass for routing signals between other cells (not shown) located on both sides of the terminal area of the cell shown in FIG. 4B.

The placement of the various terminals need not be limited to the layout shown in FIG. 3. Rather, other placements with different nearest neighbors can be used. Yet, any effective placement should reflect key design considerations. Among the design considerations included in the design shown in FIG. 3 are the placement of Vdd and Vss terminals in proximity to the terminals that are connected to the inputs of the first and second multiplexers 12 and 22 and a terminal that is connected to an input of the NAND gate 30, so as to implement desired input-selectable logic functions. Outputs and inputs of the logic cell for connecting to adjacent logic cells and to a routing grid should be easily accessible. In the design shown in FIG. 3 the terminals are divided into two branches that connect to four vertical metal tracks, for easy access. In particular, terminals 146 and 156 that are connected to the logic cell outputs 46 and 56 respectively, are preferably placed at the top of the terminal structure and on two separate branches, to allow maximum flexibility and minimum interference in connecting the output signals to the interconnect grid (not shown). Extra vias connected to underlying signal lines are preferably placed within the cell terminal area, for easy connection between adjacent cells without utilizing too many metal routing tracks, in order to avoid signal traffic congestion in the configuring metal layer shown in FIGS. 3, 4A & 4B.

Furthermore, terminal 156 is preferably placed in proximity to terminal 131, to provide feedback from output 56 of the logic cell of FIG. 1 to the input 31 of the NAND gate 30 of the same cell, enabling efficient implementation of a sequential flip-flop. While some terminals (such as terminals 106, 108, 126 and 156) are duplicated for easy access, this duplication should be minimized so as to minimize area consumption and unnecessary interference with underlying routing tracks (not shown). Connections between duplicated terminals are performed in the underlying metal layers of the device.

The segments 102 that form the contacts between the terminals may be applied in various ways. In one preferred embodiment these segments may be removable links. In this case, the links are pre-deposited, connecting all terminals together as shown in FIG. 3. In the configuration step the links are broken, e.g. by pulsed laser radiation, or by patterning the top metal and etching away all the undesirable links.

In another preferred embodiment, the top metal may be a blanket metal that connects all the vias 101 together. In this embodiment the blanket metal may be patterned by standard micro-lithography using a mask with the desired connection pattern. After patterning and etching preferably only the connections between the desired vias and between the vias and other signal lines are left in the top metal layer.

In yet another embodiment the segments 102 may be "make-link" segments. In this embodiment, shown in FIG. 5, the metal is produced and patterned without any of the segments 102 in place. Instead, "make-link" sites 104 are disposed in all locations where it may be desired to form links. In the configuration step the links are made selectively by either one of the linking technologies known in the art, e.g. by local metal deposition, by laser induced linking, or by electric field induced linking.

In yet another preferred embodiment, the vias 101 themselves may be configurable. In this embodiment, in the configuration step, both the upper via layer and the top metal layer are patterned and etched by standard lithographic techniques. This embodiment requires two application specific lithographic masks for configuration (e.g. a via mask and a top-metal layer mask). Considering simplicity, speed of configuration and cost of configuration, configuring the upper via and any additional layer besides the top metal is inferior to top-metal-only configuration as in the previously described embodiments.

However, when other layers besides the top metal layer participate in the configuration step, enhanced device density may be achieved, since only the necessary vias are deposited and additional metal signal lines can now be provided in the area that was otherwise occupied by unnecessary or unused via terminals.

In yet another preferred embodiment, the configurable metal layer need not be the top metal layer. Rather, one of the intermediate metal layers of the multi-metal layer device may be chosen for configuring the cells. The advantage of using an intermediate metal layer for configuration is that the configuring layer can be accessed from both metal layers above it and below it, allowing a higher level of flexibility and connectivity in the routing process. In this case the terminals shown in FIGS. 3 & 5 will still be connected to vias, but these vias may lead to either a metal layer above the configuring layer or to a metal layer underneath it. When the configuration step is carried out by using standard photolithography followed by metal etching, the ability to configure the device by modifying the layout of only a single metal layer provides significant savings in photolithographic mask costs.

In particular, the configuring layer may be the lowest metal layer of the device, lying just over the metal layer used to implement the circuit elements of the logic cell. This has the added advantage of minimizing the length of stacked vias that may be necessary in order to connect the cell inputs and outputs to its terminals in the configuring layer. This helps to reduce resistivity, improve device speed and reliability and minimize interference with the metal interconnection grid.

Figure 6:
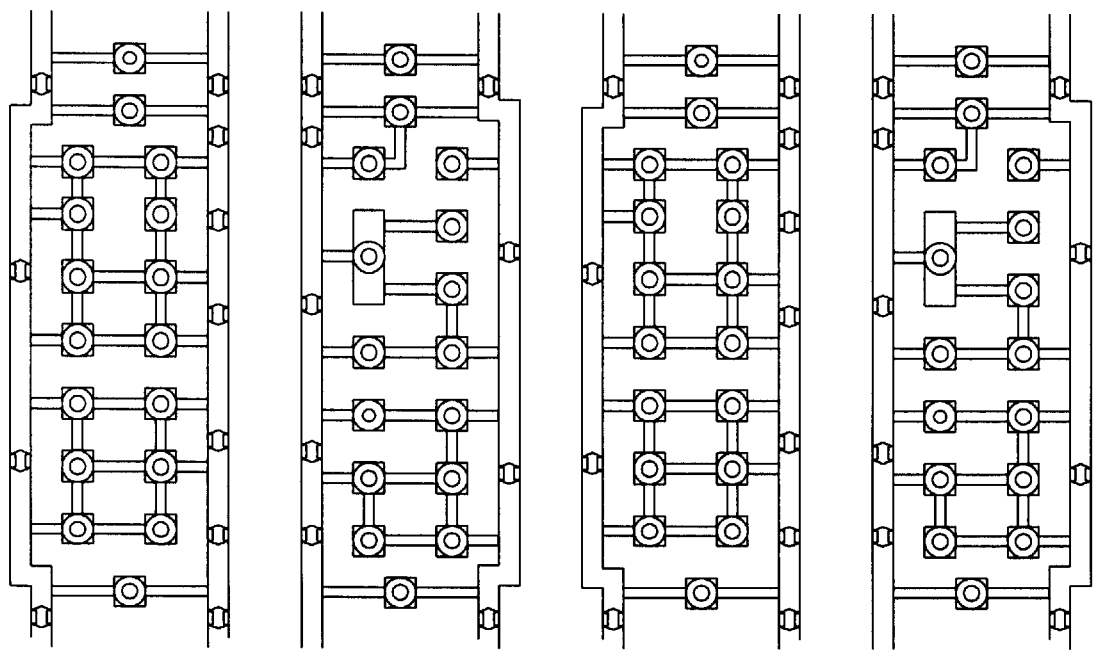
FIG. 6 is a simplified illustration of part of the configurable metal layer of a gate array comprising cells of the type illustrated in FIG. 1.

In gate array structures the logic cells and the overlying metal structure are tiled and repeated over a large area, a portion of such area shown schematically in FIG. 6. However, the repetitive structure of the logic cells may cover only a portion of the total device. Other elements such as I/O cells, memory cells, inverters, analogue structures, busses and other special designs for implementing interfaces with other components and implementing intellectual property blocks may co-exist with the tiled logic array structure.

It will be appreciated by persons skilled in the art that the present invention is not limited by what has been particularly shown and described hereinabove. The present invention includes combinations and subcombinations of the embodiments described hereinabove as well as modifications and variations thereof which would occur to a person of skill in the art upon reading the foregoing description and which are not in the prior art.

We claim:

1. A cell forming part of a customizable logic array device, said cell comprising:
   at least first and second multiplexers, each having a select input and an output;
   at least two inverters, each having an input and an output; and
   electrical connections, selectably connecting the output of said first multiplexer to either said select input of said second multiplexer or to said input of one of said at least two inverters.

2. A cell forming part of a customizable logic array according to claim 1 and wherein said at least first and second multiplexers comprise at least three multiplexers and said at least two inverters comprise at least three inverters.

3. A cell forming part of a customizable logic array device, said cell comprising:

at least first and second multiplexers, at least two inverters; and electrical connections, selectably connecting said at least first and second multiplexers and said at least two inverters such that said multiplexers operate either in parallel or in series.

4. A cell according to claim 1 and wherein said multiplexers are implemented in at least one metal layer and said electrical connections include vias connecting said at least one metal layer to another metal layer other than said at least one metal layer.

5. A cell according to claim 2 and wherein said multiplexers are implemented in at least one metal layer and said electrical connections include vias connecting said at least one metal layer to another metal layer other than said at least one metal layer.

6. A cell according to claim 3 and wherein said multiplexers are implemented in at least one metal layer and said electrical connections include vias connecting said at least one metal layer to another metal layer other than said at least one metal layer.

7. A cell according to claim 4 and wherein said another metal layer is a top metal layer.

8. A cell according to claim 4 and wherein said another metal layer is an intermediate metal layer.

9. A cell according to claim 4 and wherein said another metal layer is a metal layer lying immediately above said at least one metal layer.

10. A cell according to claim 5 and wherein said another metal layer is a top metal layer.

11. A cell according to claim 5 and wherein said another metal layer is an intermediate metal layer.

12. A cell according to claim 5 and wherein said another metal layer is a metal layer lying immediately above said at least one metal layer.

13. A cell according to claim 6 and wherein said another metal layer is a top metal layer.

14. A cell according to claim 6 and wherein said another metal layer is an intermediate metal layer.

15. A cell according to claim 6 and wherein said another metal layer is a metal layer lying immediately above said at least one metal layer.

16. A cell according to claim 1 and being further characterized in that it has a programmable logic function.

17. A cell according to claim 16 and wherein said programmable logic function is programmable by selection of at least one input to said at least first and second multiplexer and by selectable connection of said electrical connections.

18. A cell according to claim 17 and wherein said selectable connection is effected by metal deposition, pattern and etch.

19. A cell according to claim 17 and wherein said selectable connection is effected by application of laser energy to said electrical connections for eliminating portions thereof.

20. A cell according to claim 17 and wherein said selectable connection is effected by application of electrical energy to said electrical connections.

21. A cell according to claim 2 and being further characterized in that it has a programmable logic function.

22. A cell according to claim 21 and wherein said programmable logic function is programmable by selection of at least one input to said at least first and second multiplexer and by selectable connection of said electrical connections.

23. A cell according to claim 21 and wherein said selectable connection is effected by metal deposition and etching.

24. A cell according to claim 21 and wherein said selectable connection is effected by application of laser energy to said electrical connections for eliminating portions thereof.

25. A cell according to claim 21 and wherein said selectable connection is effected by application of electrical energy to said electrical connections.

26. A cell according to claim 2 and wherein said at least three inverters each have generally identical driving power.

27. A cell according to claim 2 and wherein at least two of said at least three inverters each have generally identical driving power and a third of said at least three inverters has a driving power different from the driving power of said at least two of said at least three inverters.

28. A cell according to claim 2 and wherein at least two of said at least three inverters each have generally identical driving power and a third of said at least three inverters has a driving power which is at least double the driving power of each of said at least two of said at least three inverters.

29. A customizable logic array device including a plurality of cells, each cell comprising:

at least first and second multiplexers, each having a select input and an output;

at least two inverters, each having an input and an output; and electrical connections, selectably connecting the output of said first multiplexer to either said select input of said second multiplexer or to said input of one of said at least two inverters.

30. A customizable logic array device according to claim 29 and wherein said at least first and second multiplexers comprise at least three multiplexers and said at least two inverters comprise at least three inverters.

31. A customizable logic array device including a plurality of cells, each cell comprising:

at least first and second multiplexers, at least two inverters; and electrical connections, selectably connecting said at least first and second multiplexers and said at least two inverters such that said multiplexers operate either in parallel or in series.

32. A cell according to claim 1 and comprising no more than three multiplexers, no more, than five inverters and only a single NAND gate.

* * * * *